United States Patent [19]

Lawson et al.

[11] 4,189,681
[45] Feb. 19, 1980

[54] BANDPASS FILTER HAVING LOW PASSBAND PHASE SHIFT

[75] Inventors: Kenneth D. Lawson, Cataumdet; Neil L. Brown, Falmouth, both of Mass.

[73] Assignee: Neil Brown Instruments Systems, Inc., Cataumet, Mass.

[21] Appl. No.: 947,256

[22] Filed: Sep. 29, 1978

[51] Int. Cl.² ............................................. H03F 1/34
[52] U.S. Cl. ................................. 330/109; 330/294
[58] Field of Search ............... 330/107, 109, 294, 303, 330/326; 328/167

[56] References Cited

U.S. PATENT DOCUMENTS 3,361,991  1/1968   Wyndrum ..................... 330/109 X
3,659,212  4/1972   Saliga ........................... 328/167
4,015,224  3/1977   Benzinger .................. 330/107 X
4,057,766  11/1977  Lee .............................. 330/107

Primary Examiner—James B. Mullins

[57] ABSTRACT

An active filter which can achieve extremely high attenuation of frequencies outside the passband while maintaining a very low phase shift of signals within the passband. A preferred embodiment is described in which two, second-order, multiple-feedback, active filter circuits are cascaded and the output of the second filter is fedback to the input of the first filter to realize a fourth-order filter which has very high attenuation of signals falling outside the passband while providing very low phase shifts of signals within the passband.

8 Claims, 7 Drawing Figures

BANDPASS FILTER HAVING LOW PASSBAND PHASE SHIFT

The U.S. government has certain rights in this invention under contract no. N-0014-75-C-0113, awarded and administered by O.N.R.

FIELD OF THE INVENTION

The present invention is related to filters and in particular to active bandpass filters.

BACKGROUND OF THE INVENTION

Filters of many different types have long been used as basic building blocks in electronic signal processing circuitry. One particular type of filter is a bandpass filter which is used to select frequencies within a certain range from an input signal and to reject frequencies outside that range which also may be in the input signal.

With the development of modern, solid state circuitry, including operational amplifiers having high gain-bandwidth products, active filters are being used more frequently to implement bandpass filter functions. Such filters are capable of achieving very high Q's using relatively compact circuits compared with previous passive multi-pole bandpass circuits. However, active circuits are frequently rather sensitive to variations in circuit parameters. In applications where the phase shift of the signal in the passband is critical, this sensitivity is undesirable since small changes in circuit parameters can result in relatively large changes in the frequencies of the filter poles, and hence the phase shift in the passband.

SUMMARY OF THE INVENTION

The present invention includes an active filter which can achieve high attenuation of frequencies outside the passband while maintaining a very low phase shift of signals within the passband. A preferred embodiment is described in which two, second-order, multiple-feedback, active filter circuits are cascaded and the output of the second filter is fedback to the input of the first filter. By correctly chosing the frequency response of these filters, a fourth-order filter is implemented which has very high attenuation of signals falling outside the passband while providing very low phase shifts of signals within the passband.

DESCRIPTION OF THE DRAWINGS

The advantages and operation of the present invention will become more clear upon reading the following description of the preferred embodiment in conjunction with the accompanying drawings of which.

DETAILED DESCRIPTION OF THE PREFERRED EMBODIMENT

Figure 1:
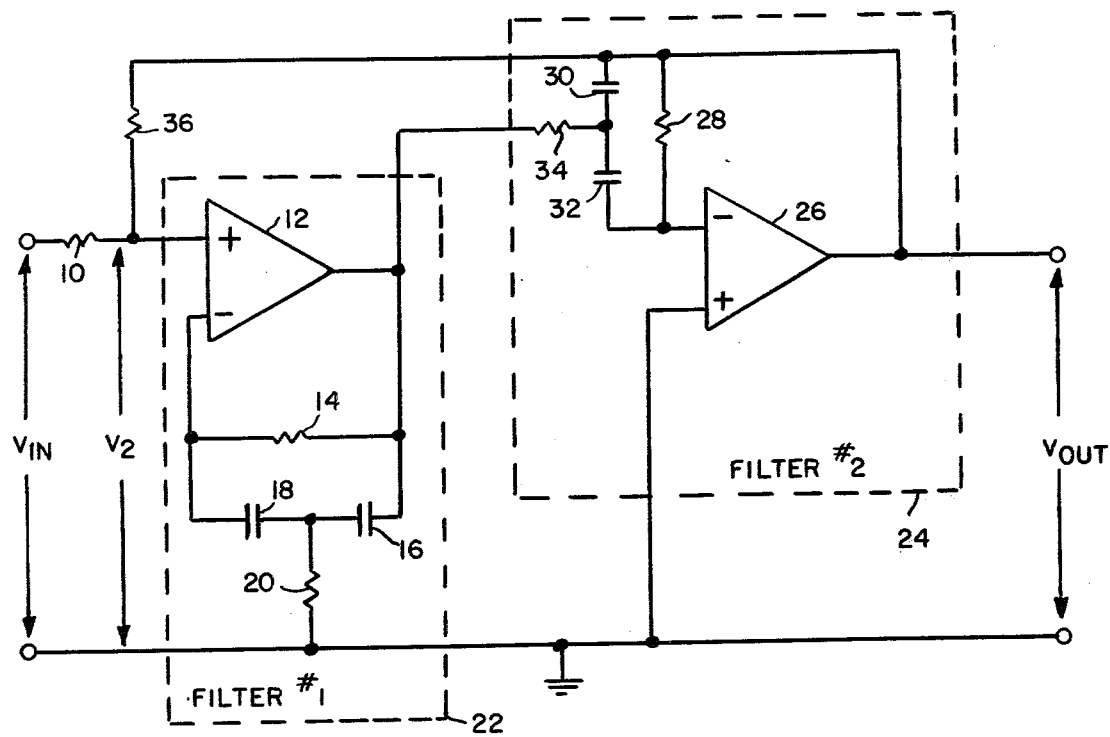
FIG. 1 is a circuit schematic of the preferred embodiment of the present invention.

Referring to FIG. 1, there is shown a preferred embodiment which illustrates the operation of the present invention. An input signal $V_{IN}$ is applied via an input resistor 10 to the non-inverting input of an operational amplifier 12. The output of on-amp 12 is fedback to its inverting input via the parallel combination of a resistor 14 and series-connected capacitors 16 and 18. The junction of capacitors 16 and 18 is connected to ground via a resistor 20. The above-described circuit is shown enclosed within dotted box 22 and composes a two-pole multi-feedback active filter. This circuit will be referred to below as filter #1.

The output from op-amp 12 is applied to a second two-pole multiple-feedback filter shown within dotted box 24, of a type which is well known. Similarly to filter #1, the second filter #2, includes an op-amp 26 whose output is fedback to an inverting input via a resistor 28 in parallel with series connected capacitors 30 and 32. The non-inverting input to op-amp 26 is connected to ground. The input to filter 24 is applied to the junction of capacitors 30 and 32 via a resistor 34; and the input to filter #2 is taken from the output of filter #1.

The output signal, $V_{OUT}$, is taken from the output of op-amp 26. The output of op-amp 26 is also fedback and applied to the input of filter #1 via a feedback resistor 36. Since the input to filter #1 is applied to the non-inverting input of op-amp 12 and the input to filter #2 is applied to the inverting input of op-amp 26, the feedback provided by resistor 36 is negative feedback.

The operation of the circuit can be more clearly described by first considering the operation of each of the active filters #1 and #2. The gain, $A_1$, of active filter #2 is given by:

$$A_1(s) = (sGB/s^2 + sB + \omega_o^2) \qquad (1)$$

where $$G = (-R_2/2R_1) \qquad (2)$$

$$B = (2/R_2C) \qquad (3)$$

$$\omega_o^2 = (1/R_1R_2C^2) \qquad (4)$$

In the equations above, G is equal to the gain at resonance of the active filter, B is the bandwidth of the filter, $\omega_o$ is the resonant frequency of the filter, and s is the complex frequency.

Figure 2:
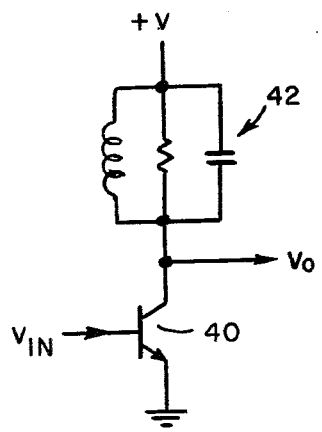
FIGS. 2 and 4 show equivalent circuits of two filters which are components of the preferred embodiment.
Figure 3:
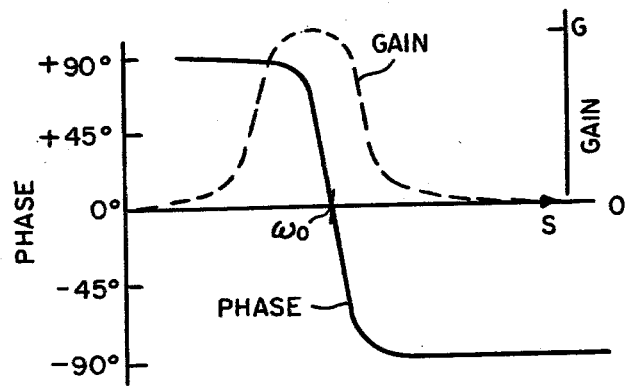
FIGS. 3 and 5 show the gain and phase characteristics of the filters of FIGS. 2 and 4.

Bandpass filter #2 has a transfer function similar to a conventional passive LC tuned circuit, and bandpass filter #2 may be modeled by the circuit shown in FIG. 2 in which a parallel RLC circuit 42 provides the load to a transistor 40. The frequency response of filter #2 is shown in FIG. 3, where the solid line represents the phase shift of the filter as a function of frequency and the dotted line represents the gain. As can be seen from FIG. 3, the amplitude peaks at the resonant frequency $\omega_o$. The phase shift through the filter changes rapidly in the vincinity of the resonant frequency and asymptotically approaches +90 and −90 degrees below and above the resonant frequency respectively.

Figure 4:
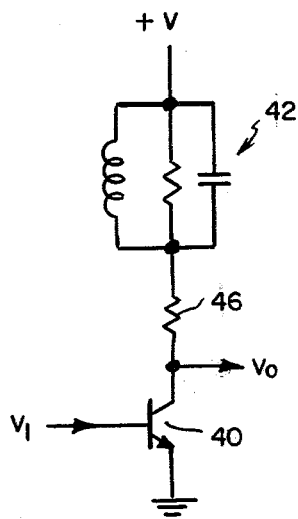
Figure 5:
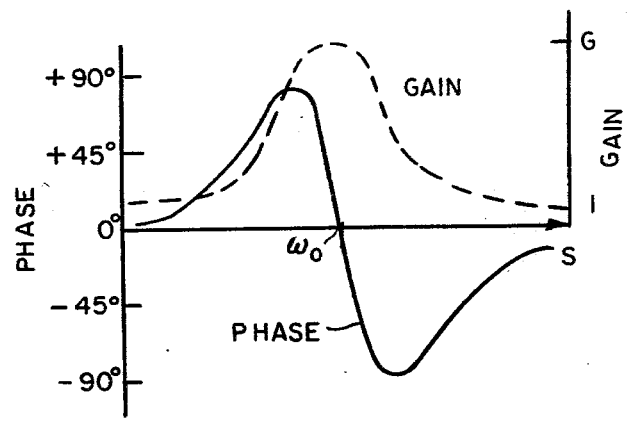

Going now to bandpass filter #1, the frequency response of filter #1 is given by:

$$A_2(s) = 1 - A_1(s) \qquad (5)$$

Where $A_1(s)$ is the frequency response for filter #2, given above in equation (1). The circuit equivalent of bandpass filter #1 is shown in FIG. 4. The phase and amplitude response of the filter are shown in FIG. 5. Similarly to bandpass filter #2, the amplitude has a peak at the resonant frequency $\omega_o$, and the phase changes rapidly from a positive to a negative phase shift in the vicinity of the resonant frequency, passing through zero degrees phase shift for a frequency equal to the resonant frequency. However, due to the resistor 46 in series with RLC circuit 42, the gain through the filter does not fall off to zero at frequencies distant from the resonant frequency, but rather the gain asymptotically approaches 1 for frequencies much higher and much lower than the resonant frequency. Resistor 46 also changes the phase shift through the filter. Rather than approaching +90 and −90 degrees, the phase shift peaks at somewhat less than +90 and −90 degrees below and above the resonant frequency and then decreases for frequencies further away from the resonant frequency, asymptotically approaching zero degrees phase shift.

The parameters of either of the filters #1 and #2 described above may be chosen to provide a passband which passess desired signals and attenuates undesired signals outside of the passband in most applications. However, from FIGS. 3 and 5 it can be seen that for such filters the phase shift through the passband changes very rapidly. Bandpass filters are frequently used to select a signal of a particular frequency within the passband while attenuating other signals lining outside of the passband. In applications where information is encoded in the phase of the passband signal, it is important that the phase shift through the filter of this signal remain absolutely constant.

For filters with characteristics such as those shown in FIGS. 3 and 5, this is frequently difficult to do, especially where the acceptable variation in the phase shift is very small. In a practical filter, the values of the filter components will vary. This may be caused by changes in the temperature or other environmental conditions, and it may also be caused by the fact that these values also tend to drift with time. The result is that the parameters of the filter change slightly, and in particular the resonant frequency $\omega_o$ may change slightly. Due to the very rapid change of phase with a change in frequency around the resonant frequency, such a change may result in a significant phase shift of a signal applied to the filter.

Figure 6:
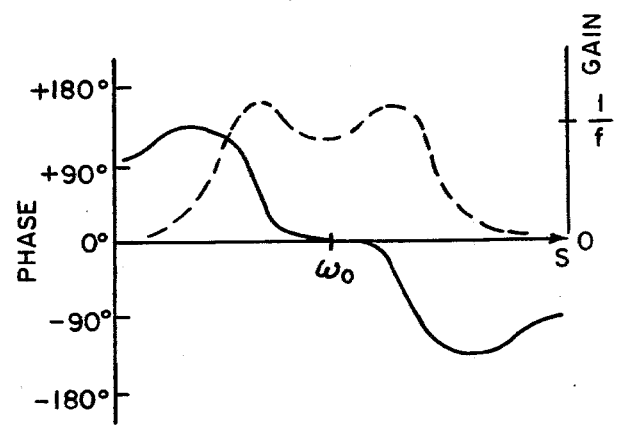
FIG. 6 shows the gain and phase characteristic of the filter shown in FIG. 1.

It has been found that by cascading the two filters shown and described above and by providing a feedback around these filters, a bandpass filter may be provided which is capable of high attenuation of signals outside of a predetermined passband while maintaining a relatively constant phase throughout the passband so as to minimize variations in the phase shift of the filter caused by small changes in the filter components. The gain and phase characteristics of such a filter are shown in FIG. 6.

Referring back to FIG. 1, active filters #1 and #2 are cascaded, and the output of filter #2 is fedback to the input of filter #1 via a resistor 36. The amount of feedback is determined by the ratio of feedback resistor 36 and input resistor 10.

This ratio is denoted by f and is given by:

$$f = (R_{35}/R_{36} + R_{10}) \qquad (6)$$

thus, the closed loop response of filter in FIG. 1 is given by:

$$A_{CL}(s) = (A_o(s)/1 + A_o(s)f) \qquad (7)$$

where $A_o(s)$ is the combined gain of filters 1 and 2 and is given by:

$$A_o(s) = A_1(s)A_2(s) \qquad (8)$$

Typically, the open loop gain, $A_o(s)f$, is much greater than 1 for frequencies close to the resonant frequency. Thus, the closed loop response $A_{CL}(s)$ is essentially equal to 1/f near the resonant frequency. Since the feedback is resistive and is independent of frequency, the phase in this region is essentially constant. From FIGS. 3 and 5 it can be seen that the gain of both filters 1 and 2 falls off rapidly as the frequency moves away from the resonant frequency. At these frequencies, the open loop gain becomes much less than one; and the right-hand term in the denominator of equation (7) may be neglected. For these frequencies the response of the filter FIG. 1 is essentially equal to $A_o$, the product of the frequency responses of filters 1 and 2. This is more clearly shown in FIG. 6.

Two things should be noted from FIG. 6. First, the gain curve is broader than for either filter alone and has two peaks equally spaced about the resonant frequency $\omega_o$. The double peaks result from a splitting of the two sets of conjugate pole pairs, one pair from each filter, due to the negative feedback. Second, the phase characteristic of the filter is much flater in the vicinity of the resonant frequency than for either active filter used alone without feedback. At frequencies far from the resonance frequency of the filter, the phase shift approaches 90 degrees.

One important criterion of high-Q active filters is their stability. By combining the two different types of filters described having the phase characteristics shown in FIGS. 3 and 5, a very stable filter may be implemented. Instability in a filter using negative feedback results when the open-loop phase shift approaches 180 degrees, converting the negative feedback into positive feedback. By combining filter #2 with a filter such as filter #1 having a phase shift which returns to zero at frequencies distant from the resonant frequency, a stable filter is provided.

Figure 7:
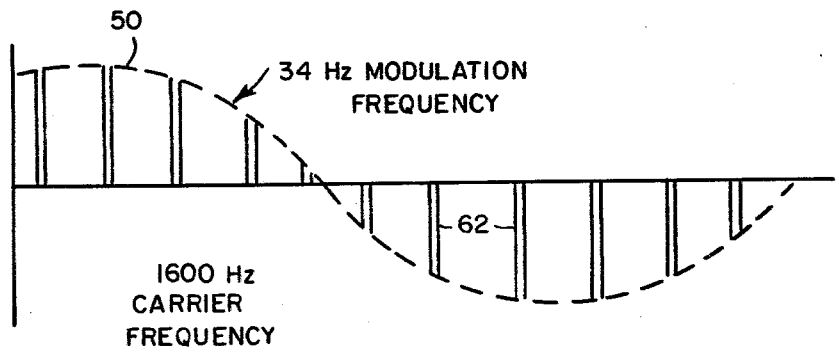
FIG. 7 shows an input signal for a representative application of the present invention.

The following example illustrates a practical application of the present invention. Referring to FIG. 7, a 34 Hz waveform 60 is represented by amplitude modulated pulses 62 having a repetition frequency of 1600 Hz. The modulation signal has a frequency of 34 Hz. The information in this signal which is ultimately desired is the phase of the 34 Hz modulation envelope. The spectrum of the signal shown in FIG. 7 includes a component at 34 Hz, which is the modulation frequency signal to be extracted, and components at 1600 hz and odd multiples thereof, which are the harmonics making up the 1600 Hz carrier waveform. The 1600 Hz waveform must be attenuated by 50 dB and the 34 Hz waveform must be recovered with a phase error on the order of 1/10 of 1 degree or less.

The following values for the components shown in FIG. 1 give a resonant frequency $\omega_o$ of 33.86 Hz, a bandwidth B of 6.77 Hz, and a gain G of 100 per filter or 10,000 for the two filters cascaded. The value of f is 0.01.

| 10 | 4.99 kΩ | 28 | 1 Meg |
|----|---------|----|-------|
| 14 | 1 Meg | 30 | 0.047 mFd |
| 16 | 0.047 mFd | 32 | 0.047 mFd |
| 18 | 0.047 mFd | 34 | 10 kΩ |

-continued

| 20 | 10 kΩ | 36 | 499 kΩ |
|----|-------|-----|--------|

For filter of the type shown in FIG. 1 with the above values, the open-loop and closed-loop gain and phase values as a function of frequency are tabulated in Table 1. From Table 1, it can be seen that the relative amplitudes of the 1600 Hz carrier frequency and the 34 Hz modulation frequency are 0.22/96.19. This corresponds to an attenuation of the 1600 Hz carrier frequency by a factor of 52.8 dB. Inspection of the closed-loop phase characteristic around the resonant frequency shows that the phase characteristic is much flater than with conventional types of filters.

There has been described above a new bandpass filter which provides a large attenuation of unwanted signals while maintaining a relatively flat phase shift characteristic within the filter pass-band. It should be appreciated that modifications will be made in applying the teachings of the present invention to different applications, and the description of a preferred embodiment to illustrate the operation and advantages of present invention should not be construed as a limitation upon the invention. Accordingly, the invention should be interpreted only in accordance with the following appended claims.

TABLE 1

| Freqency (Hz) | Open-Loop | | Closed Loop | |
|---|---|---|---|---|
| | Gain | Phase | Gain | Phase |
| 2 | −.69 | 119.8 | −.69 | 119.45 |
| 4 | −1.89 | 138.0 | −1.90 | 137.23 |
| 8 | −6.84 | 152.9 | −7.20 | 150.99 |
| 16 | −37.67 | 157.0 | −55.44 | 144.45 |
| 20 | −81.71 | 153.3 | −176.79 | 100.59 |
| 21 | −100.00 | 151.7 | −203.15 | 76.95 |
| 21.5 | −110.88 | 150.71 | −203.79 | 65.23 |
| 22 | −123.17 | 149.67 | −197.33 | 54.79 |
| 24.0 | −191.79 | 144.67 | −153.87 | 28.24 |
| 26.0 | −313.50 | 135.98 | −124.95 | 16.25 |
| 28.0 | −547.83 | 122.65 | −109.43 | 9.78 |
| 30.− | −1030.95 | 99.68 | −101.19 | 5.61 |
| 32.0 | −1931.25 | 58.39 | −97.24 | 2.48 |
| 34.0 | −2545.84 | −4.59 | −96.19 | −.17 |
| 36.0 | −1854.61 | −62.28 | −97.42 | −2.69 |
| 38.0 | −1092.53 | −96.94 | −100.70 | 5.30 |
| 40.0 | −671.40 | −116.40 | −106.07 | −8.22 |
| 45.0 | −274.47 | −138.49 | −130.83 | −18.61 |
| 50.0 | −150.71 | −147.42 | −176.87 | −39.66 |
| 52 | −124.53 | −149.56 | −196.38 | −53.80 |
| 53 | −114.07 | −150.44 | −202.61 | −62.25 |
| 54 | −104.95 | −151.22 | −204.51 | −71.33 |
| 55 | −96.96 | −151.92 | −201.22 | −80.62 |
| 60 | −68.57 | −154.44 | −96.40 | −142.44 |
| 100 | −15.31 | −156.87 | −16.38 | −155.03 |
| 200 | −3.55 | −146.65 | −3.59 | −146.09 |
| 1600 | −0.22 | −101.70 | −0.22 | −101.64 |

What is claimed is:

1. A bandpass filter comprising:
a bandpass filter having a transfer function $F_1$ given by:

$$F_1 = (As/s^2 + Bs + C)$$

where s is the complex frequency and A, B, and C are selected so that the filter has at least two complex conjugate poles;
a bandpass filter havng a transfer function $F_2$ given by:

$$F_2 = (Ds^2 + Es + F/s^2 + Gs + H)$$

where D, E, F, G, and H are chosen so that the filter has at least two complex conjugate poles;
means for applying the output signal from a first one of the filters to an input of the second one of the filters; and
feedback means for providing negative feedback from the output of the second filter to an input of the first filter.

2. The bandpass filter of claim 1 wherein the resonant frequencies of the first and second filters are equal.

3. A bandpass filter comprising:
a first two-pole, bandpass filter having an input and an output, and having a pass-band disposed about a resonant frequency such that signals applied to the filter having frequencies outside of the pass-band are attenuated with respect to signals having frequencies within the pass-band;
the first filter having a phase shift between the input and the output thereof as a function of frequency which phase shift asymptotically approaches 90 degrees at frequencies increasingly removed from the resonant frequency thereof;
a second two-pole bandpass filter having an input and an output and a pass-band disposed about a resonant frequency such that signals applied to the input of the second bandpass filter are attenuated with respect to signals having frequencies within the pass-band;
the second filter having a phase shift between the input and the output thereof as a function of frequency which phase shift has a maximum and minimum phase shift of less than 90 degrees at frequencies below and above the resonant frequency, and asymptotically approaches zero degrees phase shift for frequencies below and above the maximum and minimum phase shift frequencies;
the first and second filters being connected in series; and
feedback means for applying the output of the series-connected filters to the input of the series-connected filters to provide negative feedback.

4. The bandpass filter of claim 3 wherein the resonant frequencies of the first and second filters are equal.

5. The bandpass filter of claims 1, 2, 3, or 4 wherein the first and second bandpass filters each include a multiple-feedback active filter circuit.

6. The bandpass filter of claim 5 wherein the first and second bandpass filters each include:
a high gain differential amplifier having an inverting input and an output; and
a feedback circuit between the output of the amplifier and the inverting input including a resistor in parallel with two series connected capacitors.

7. The bandpass filter of claim 6 wherein the feedback means includes a resistive circuit for providing negative feedback having essentially zero phase shift.

8. A bandpass filter comprising:
a first differential amplifier having an inverting input terminal, a non-inverting input terminal, and an output terminal;
a first feedback circuit connected between the first amplifier output terminal and inverting input terminal, including a resistor in parallel with two series-connected capacitors;
a second differential amplifier having an inverting input terminal, a non-inverting input terminal and an output terminal;

a second feedback circuit connected between the second amplifier output terminal and inverting input terminal, including a resistor in parallel with two series-connected capacitors;

a common terminal connected to the non-inverting input terminal of the second amplifier;

a resistor connected between the common terminal and the junction of the series-connected capacitors in said first feedback circuit;

a resistor connected between the first amplifier output terminal and the junction of the series-connected capacitors in said second feedback circuit;

a resistor connected between the second amplifier output terminal and the first amplifier non-inverting input terminal; and means for applying an input signal to the non-inverting input terminal of the first amplifier.

* * * * *